United States Patent

Kim et al.

[11] Patent Number: 5,824,453
[45] Date of Patent: Oct. 20, 1998

[54] FABRICATING METHOD OF GAAS SUBSTRATE HAVING V-SHAPED GROOVES

[75] Inventors: Sung-Bock Kim; Seong-Ju Park; Jeong-Rae Ro; El-Hang Lee, all of Daejeon, Rep. of Korea

[73] Assignee: Electronics and Telecommunications Research Institute, Daejeon-shi, Rep. of Korea

[21] Appl. No.: 946,915

[22] Filed: Oct. 9, 1997

Related U.S. Application Data

[63] Continuation of Ser. No. 801,724, Jan. 13, 1997, abandoned, which is a continuation of Ser. No. 341,866, Nov. 15, 1994, abandoned.

[30] Foreign Application Priority Data

May 16, 1994 [KR] Rep. of Korea ................. 1994-10638

[51] Int. Cl.[6] ........................................................ G03F 7/00
[52] U.S. Cl. ........................... 430/313; 430/314; 438/42; 438/44
[58] Field of Search ................................... 430/311, 313, 430/314, 315, 318, 327; 438/42, 43, 44, 494

[56] References Cited

U.S. PATENT DOCUMENTS 5,316,967 5/1994 Kaneno ............................ 437/105

OTHER PUBLICATIONS

Usami, et al.: "Fabrication of Sige/Si quantum wire structures on a V–Groove patterned Si substrate by gas–source Si molecular beam epitaxy"; pp. 539–541, Solid–State Electronics vol. 37, Nos. 4–6, 1994.

Tsukamoto, et al.: "Fabrication of GaAs quantum wires on epitaxially grown V grooves by metal–organic chemical––vapor deposition"; pp. 533–535, J. Appl. Phys., vol. 71(1), Jan. 1, 1992.

Kapon, et al.: "Two–dimensional quantum confinement in multiple quantum wire lasers grown by OMCVD on V–grooved substrates"; pp. 593–600, Surface Science 267(1993), North–Holland.

*Primary Examiner*—Kathleen Duda
*Attorney, Agent, or Firm*—Jacobson, Price, Holman & Stern, PLLC

[57] ABSTRACT

Disclosed is a fabricating method of a GaAs substrate having a V-shaped groove in a higher density, that is a double density, the method comprising the steps of forming a $Si_3N_4$ layer on a main surface of the GaAs substrate; patterning the $Si_3N_4$ layer using a photo-lithography to form a patterned $Si_3N_4$ layer having a minimum width; wet-etching the GaAs substrate using the patterned $Si_3N_4$ layer as a mask, so as to form (111) and (100) surfaces of the GaAs substrate beneath the patterned $Si_3N_4$; selectively growing a GaAs film on the GaAs substrate etched thus using the patterned $Si_3N_4$ layer as a mask so as to form the GaAs film with two (111) facets only on a (100) surface of the GaAs substrate; and removing the $Si_3N_4$ layer. The V-shaped grooves can be formed on a GaAs substrate utilizing a difference of growth rate caused by surface orientation of the substrate, and therefore the grooves can be formed in double density.

3 Claims, 1 Drawing Sheet

FABRICATING METHOD OF GAAS SUBSTRATE HAVING V-SHAPED GROOVES

This is a continuation of Ser. No. 08/801,724, filed on Jan. 13, 1997, abandoned, which is a continuation of Ser. No. 08/341,866, filed on Nov. 15, 1994, abandoned.

BACKGROUND OF THE INVENTION

1. Field of the Invention

The present invention relates to a fabricating method of a substrate suitable to a semiconductor device utilizing a quantum efficiency, and more particularly to a fabricating method of a GaAs substrate having V-shaped grooves in high density thereon in accordance with growth speed which is dependent on surface orientation of GaAs substrate.

2. Description of the Prior Art

Photo-lithography as well-known in this art is utilized to form a geometrical pattern on a wafer, transcribing a predetermined pattern of a mask to a thin photoresist film, which is deposited on a semiconductor substrate.

By transcription of this photo-lithography, a patterned photoresist film is formed on the substrate. The patterned photoresist film is mainly used as an etching mask to selectively remove a portion of the substrate, or a portion of an insulating in case that the insulating layer is formed between the substrate and the patterned photoresist film.

In case that this photo-lithography is used to form a V-shaped groove in high density on a main surface of a substrate, since an incident ultraviolet light toward the substrate is not fine in beam width enough to form the groove having fine width, a V-shaped groove in high density is seriously restricted in formation.

To solve the above-described restriction, a lithography using an electron beam has been proposed. However, when an electron beam is applied to form a predetermined pattern layer on a wafer, since patterned shapes in the pattern layer must be formed one after another, lithography using an electron beam can not be utilized in mass-production of a semiconductor device. Also, since a lithographic apparatus is very expensive, a semiconductor device can not be produced economically.

SUMMARY OF THE INVENTION

It is an object of the present invention to provide a fabricating method of GaAs substrate having a V-shaped grooves in high density in which the V-shaped groove is formed on the GaAs substrate in accordance with a difference of growth speed which is dependent upon surface orientation of the substrate when a thin film of GaAs is selectively grown on the GaAs substrate in the opening area of the mask.

According to an aspect of the present invention, it relates to a fabricating method of a GaAs substrate having a V-shaped groove in high density, the method comprising the steps of forming a $Si_3N_4$ layer on a main surface of the GaAs substrate; patterning the $Si_3N_4$ layer using photo-lithography to form a patterned $Si_3N_4$ layer having a minimum width; wet-etching the GaAs substrate using the patterned $Si_3N_4$ layer as a mask, so as to form (111) surface of the GaAs substrate beneath the patterned $Si_3N_4$; selectively growing a GaAs film on the GaAs substrate etched thus using the patterned $Si_3N_4$ layer as a mask so as to form the GaAs film with (111) and (100) surfaces only on a (100) surface of the GaAs substrate; and removing the $Si_3N_4$ layer.

In this method, in the step of wet-etching a sulfuric acid group is used as an etching solution.

Because V-shaped grooves can be formed on a GaAs substrate utilizing a difference of growth speed caused by surface orientation of the substrate, the grooves can be formed in a higher density.

BRIEF DESCRIPTION OF THE DRAWINGS

This invention may be better understood and its object and advantage will become apparent to those skilled in the art by reference to the accompanying drawings as follows.

DESCRIPTION OF THE PREFERRED EMBODIMENT(S)

Figure 1A:
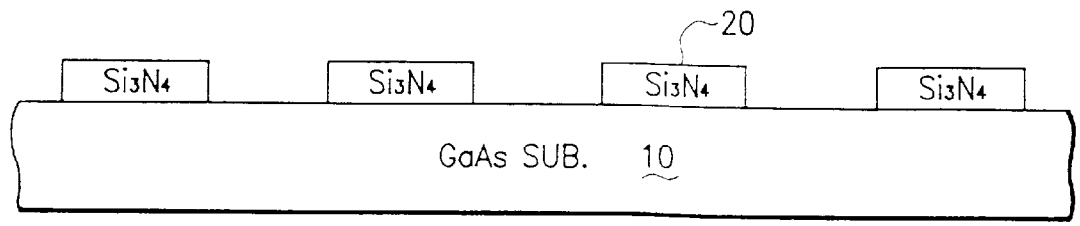
FIGS. 1A to 1D are cross-sectional views showing the fabricating processes of a GaAs substrate having V-shaped grooves in accordance with the embodiment of the present invention.

Referring to FIG. 1A, on a GaAs substrate 10 a patterned $Si_3N_4$ layer 20 is formed through a photo-lithography using an ultraviolet light, an opening 30 being formed between adjacent layers 20. The patterned $Si_3N_4$ layer 20 is oriented along the (011) direction of the substrate 10.

First, a $Si_3N_4$ layer is deposited on the GaAs substrate having a (100) surface by a plasma enhanced chemical vapor deposition (PECVD) at a temperature of 350°C., and then a rinsing process is performed. In detail, the substrate 10 deposited with $Si_3N_4$ thereon is rinsed in an ultrasonic cleaner using an acetone solution, a methanol solution or a deionized water for approximately five minutes.

Next, on the $Si_3N_4$ layer a photoresist layer is formed using a spin-coating method. The photoresist layer is composed of an S1 1400–27 type photoresist, and is coated at 5000 rpm, for 30 seconds.

Subsequently, the structure formed thus is soft-baked in a hot plate or an oven, at 90°C., for 20 minutes. After soft-baking, exposure/development and hard-baking processes are sequentially performed. For example, developing is carried out in a mask aligner with 8.5 mW, for 3 seconds, and developing is carried out by a developing solution for about 23 seconds. The developing solution contains AZ351 and $H_2O$ at the rate of 1 to 4. The hard-baking process is performed in a hot plate or an oven at 120°C., 10minutes.

After an etching process in which the $Si_3N_3$ layer is dipped in a buffered oxide etchant (BOE) for about 15 seconds, it is rinsed in an ultrasonic cleaner using a trichloroethylene etchant (TCE), acetone, and methanol for about 5 minutes each. As a result, the patterned $Si_3N_4$ layer 20 is formed on the substrate 10 as shown in FIG. 1A.

Figure 1B:
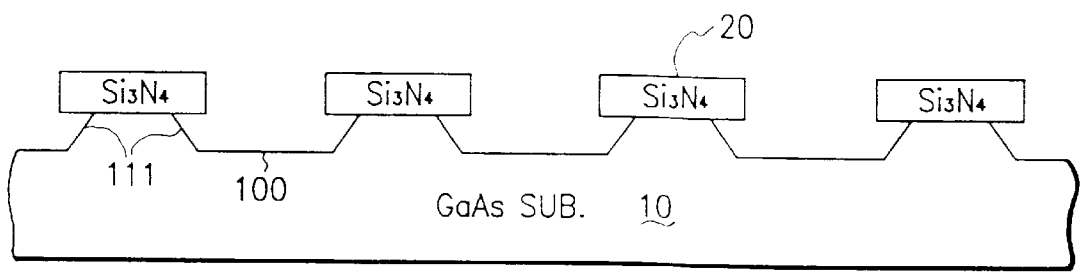

In addition, as shown in FIG. 1B, a wet-etching process is performed and thus (111) surface of the substrate 10 are formed beneath the patterned $Si_3N_4$ layer 20. Side facets Etching solution used in this etching process is a sulfuric acid solution of $1H_2SO_4{:}8H_2O_2{:}4H_2O$. Then, a portion of the substrate 10 is etched back to the extent of 1000 Å from the surface thereof, maintaining the (100) and (111) surfaces. As a result, the substrate structure shown in FIG. 1B can be formed.

Figure 1C:
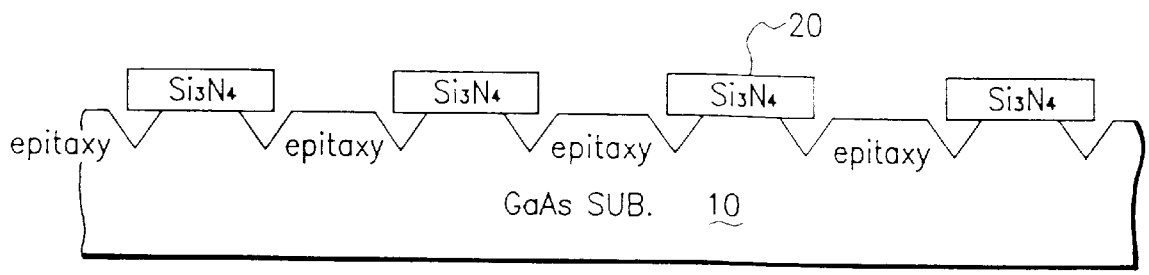

Next, a GaAs material 50 is epitaxially grown on the substrate 10 to form a GaAs thin film having 1000 Å in thickness. In this epitaxial process, growth rate of the GaAs material is faster in the (100) surface of the substrate 10 than in the (111) surface of the substrate 10. For this reason, V-shaped grooves are formed on the substrate 10 as shown in FIG. 1C.

Figure 1D:
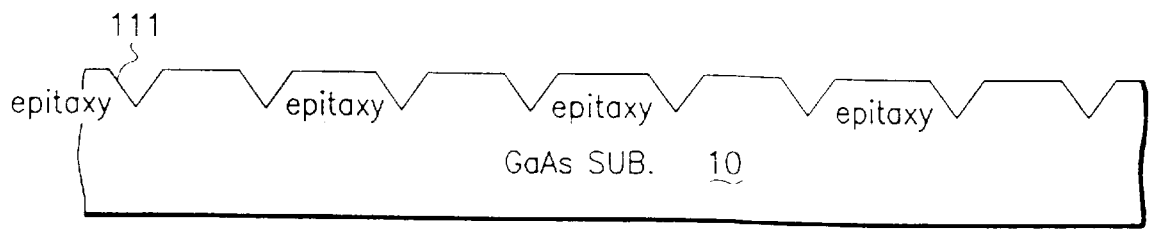

Finally, the patterned $Si_3N_4$ layer 20 is removed by a well-known etching process, and thus the GaAs substrate 10 having a V-shaped groove in high density is completed as shown in FIG. 1D.

According to the method of the present invention, because V-shaped grooves can be formed on a GaAs substrate utilizing a difference of growth rate caused by surface orientation of the substrate, the grooves can be formed in higher-density, i.e. in density, as compared to the conventional method.

Furthermore, the V-shaped grooves can be fabricated on the substrate by simple processes.

In addition, since the method of the present invention can utilize a photo-lithography using an ultraviolet light, it can be applied to mass-produce a semiconductor device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A fabricating method of a GaAs substrate having V-shaped grooves, the method comprising the steps of:

forming a $Si_3N_4$ layer on a GaAs substrate having a (100) surface;

patterning the $Si_3N_4$ layer using photo-lithography to form a $Si_3N_4$ masking layer;

wet-etching the GaAs substrate using the patterned $Si_3N_4$ masking layer as a mask, so as to form GaAs side facets each having a (111) surface beneath the patterned $Si_3N_4$;

selectively epitaxially growing a GaAs film on the etched GaAs substrate to form the GaAs substrate having V-shaped grooves; and removing the $Si_3N_4$ layer.

2. The fabricating method according to claim 1, wherein the step of wet-etching is performed with sulfuric acid as an etching solution.

3. The fabricating method according to claim 2, wherein the sulfuric acid consists of $1H_2SO_4:8H_2O_2:4H_2O$.

* * * * *